(12) United States Patent
Duarte

(10) Patent No.: US 7,751,992 B2
(45) Date of Patent: Jul. 6, 2010

(54) SYSTEM OF CONTROLLING AND TRIGGERING A TRIAC AND A METHOD OF CONTROLLING THE TRIGGERING OF A TRIAC

(75) Inventor: Ronald Ribeiro Duarte, Santa Catarina (BR)

(73) Assignee: Empresa Brasileira De Compressores S.A. - Embraco, Joinville, SC (BR)

( * ) Notice: Subject to any disclaimer, the term of this patent is extended or adjusted under 35 U.S.C. 154(b) by 432 days.

(21) Appl. No.: 10/595,931

(22) PCT Filed: Dec. 15, 2004

(86) PCT No.: PCT/BR2004/000243

§ 371 (c)(1),
(2), (4) Date: Mar. 28, 2007

(87) PCT Pub. No.: WO2005/064794

PCT Pub. Date: Jul. 14, 2005

(65) Prior Publication Data

US 2007/0273429 A1   Nov. 29, 2007

(51) Int. Cl.
*G01R 15/00*   (2006.01)
(52) U.S. Cl. ........................................ 702/57
(58) Field of Classification Search ............... 702/57
See application file for complete search history.

(56) References Cited

U.S. PATENT DOCUMENTS 4,737,671 A * 4/1988 Nutz et al. ................. 327/476
5,629,571 A    5/1997 Roudeski
5,734,289 A * 3/1998 Khudoshin ................. 327/438
5,994,883 A * 11/1999 Liu ............................ 323/237

FOREIGN PATENT DOCUMENTS

DE    31 14 433    11/1982
GB    1 498 397    1/1978

OTHER PUBLICATIONS

International Search Report for PCT/BR/2004/000243 completed Apr. 4, 2005.
Written Opinion of the International Searching Authority, 2005.

* cited by examiner

*Primary Examiner*—Aditya Bhat
(74) *Attorney, Agent, or Firm*—Alston & Bird LLP

(57) ABSTRACT

Disclosed is a system and method of controlling and triggering a TRIAC by actuating a load with any power factor from a single short-duration pulse at the gate of the TRIAC. The TRIAC comprising a gate, the TRIAC being connected to a load, the gate being electrically connected to a control unit, which actuates the TRIAC for selectively applying a network voltage to the load and enabling the circulation of an electric current in the load, the system comprising a gate voltage detection unit, a control unit, the gate voltage detection unit being electrically connected to a control unit, the control unit establishing a gate voltage limit value and generating a pulse at the gate of the TRIAC to keep it in conduction, the pulse at the gate being generated from a comparison between the voltage limit value established by the control unit and a voltage measured at the gate from the gate voltage detection unit, the control unit measuring the electric current and adjusting the voltage limit value in a way proportional to the current value measured.

21 Claims, 3 Drawing Sheets

US 7,751,992 B2

SYSTEM OF CONTROLLING AND TRIGGERING A TRIAC AND A METHOD OF CONTROLLING THE TRIGGERING OF A TRIAC

CROSS-REFERENCE TO RELATED APPLICATION

This application claims the priority of Brazilian patent case No. PI0305983-9 filed on Dec. 30, 2003, the content thereof being hereby incorporated by reference.

The present invention relates to a system of controlling and triggering a TRIAC as well as to a method of controlling the triggering of a TRIAC, by actuating a load with any power factor from a single short-duration pulse at the TRIAC gate.

DESCRIPTION OF THE PRIOR ART

As known from the prior art, TRIAC's are switches used mainly for controlling the level of voltage on a load.

In order to actuate a TIRAC, it is necessary to supply or drain a current pulse from the gate with respect to the main terminal 1 for an interval of time that enables the current circulating through the main terminals of the TRIAC to reach a minimum value, known as latch current. Once the current has reached this value, the pulse at the gate may be released, and the current will be naturally conducted until the instant at which it reaches a value lower than the maintenance current, known as hold current. If there is current drained or supplied to the gate at the instant when the current reaches the hold value, the TRIAC again goes into conduction and will remain in this condition if the gate signal is maintained again until the current between the main terminals reaches the latch current. The cycle may then be indefinitely repeated, to keep the TRIAC in conduction, if the current circulating through the TRIAC is monitored and the pulses at the gate are generated at the correct instants. Besides enabling the continuous conduction of the TRIAC, the monitoring of the current through the component makes possible the adequate triggering when the adjustment of the triggering angle to control the effective voltage or current in the load is wished.

There are various ways of monitoring the current that circulates through the terminals of the TRIAC for controlling its triggering at the instant immediately preceding the passage of this current by zero. One of these ways consists in monitoring the current by mans of an element in series with the TRIAC, for example, a resistor and, in as a function of the voltage read on this resistor, determining whether the current is coming close to zero value. Another way of monitoring the zero of the current consists in detecting the voltage between the main terminals of the TRIAC, but in this case the detection of voltage between the terminals indicates that the TRIAC is already in the open state and, even if it is immediately triggered, the component has already discontinued the current. The most effective method for monitoring current by means of the TRIAC consists in measuring the voltage at the gate with respect to the main terminal 1, which reflects the current that circulates through the main terminals. This idea is described in the North American patent documents U.S. Pat. No. 5,629,571 and U.S. Pat. No. 5,734,289. In Roudeskl (U.S. Pat. No. 5,629,571), two comparators are used, in addition to various other elements for controlling the circuit, so that the circuit could not be implemented directly by using low-cost microcontrollers. Further, according to the teachings of this reference, the monitoring of the voltage at the gate of the TRIAC is foreseen. This document, however, does not disclose the adjustable control of this magnitude as a function of the current circulating in the load, which results in an application with a limited range of current in the load.

In Khudoshin (U.S. Pat. No. 5,734,289), two comparators are also used, and the implementation may be made by using a microcontroller. However, just as in the preceding case, the circuit does not allow one to monitor a wide range of current values by means of the TRIAC, which entails failure at the command of the TRIAC gate or long-duration pulse at the gate.

The functioning principle of the circuits consists in comparing the voltage measured at the TRIAC gate with respect to the main terminal 1, which directly reflects the current conducted by the TRIAC with prefixed voltage values, which may be called voltage +limit and −limit values. If the voltage measured at the gate is between the +limit and −limit values, there is generation of a signal to the TRIAC gate. In order to compare the voltage measured at the gate with two different values, the circuits make use of two analog comparators. FIG. 3 represents the voltage curve at the gate equivalent to the instant of passage of two currents called $I_1$ and $I_2$ by zero, as well as the positive value of the comparison voltage, called +limit. The same curve is symmetrically repeated during the rise of the current, passing, in this case, by the −limit.

When the voltage at the TRIAC reaches, during the drop of the current, the +limit value, which is represented by the instant $t_1$ when the voltage of the gate is equivalent to a current $I_1$ and at the instant $t_2$ when the voltage of the gate is equivalent to another current $I_2$, the circuit generates one of more pulses at the TRIAC gate. As can be seen in FIG. 3, the higher the value of the current, the shorter the time between the detection by the comparator and the passage by zero.

The drawback of the different detection times lies in the fact that the control units need a minimum time for analysis of the measured signal and actuation of the power step, to actuate the TRIAC gate and, if the time is very short, the processing unit will not perform the tasks of actuating at the correct instant. On the other hand, if the time is too long, the control unit has to generate a signal with a proportionally great broadness for actuating the TRIAC.

Thus, in order to solve this problem, it would be possible to fix higher and lower values for +limit and −limit, according to the current expected for the TRIAC, but any variation of this current out of the preestablished limits will entail the above-described problems. Therefore, it can be noticed that the circuits proposed in patents U.S. Pat. No. 5,629,571 and U.S. Pat. No. 5,734,289 have the drawback of permitting operation only with restricted and previously defined values of current.

OBJECTIVE AND BRIEF DESCRIPTION OF THE INVENTION

The present invention has the objective of providing a circuit for controlling and triggering a TRIAC, by using only one short-duration pulse during the passage of the current circulating through the main terminals of this TRIAC by zero. The following are characteristics of the circuit:

the possibility of implementation by using a simple and low-cost control unit;

the utilization of only one analog comparator for implementation of the circuit;

the utilization of a very simple digital-to-analog D/A converter;

the adequate control of the TRIAC for any value of load current and power factor of the load.

Thus, in order to achieve the objectives of the present invention, the system should detect, through the control unit, the level transition from the comparator output to actuation of the TRIAC. The comparator receives voltage signals from the TRIAC gate and voltage from a D/A converter, the latter being controlled by the control unit and the level transition from the comparator output occurs during the transitions of the current induced by the TRIAC from the negative state to the positive state and vice-versa (which may also be measured from the voltage at the gate), a moment when a pulse should be generated at gate G of the TRIAC with a duration that enables the current to reach the latch value.

In this way, the control unit will command the D/A converter to commute between a positive voltage +limit to a negative −limit and vice-versa at every transition received by the comparator $CP_1$. A single comparator may be used instead of the pair of comparators used in the prior art and thus generate two levels of voltage +limit and −limit.

Additionally, according to the teachings of the present invention, in order to solve the problem described before relating to different voltage values, the +limit and −limit values are varied proportionally to the values of the current circulating in the load, so that the time between the detection of the limits and the passage of the current by zero can occur in a fixed time, adequate for actuating the TRIAC correctly.

Such an adjustment of level of the +limit and −limit may be made from the calculation establishing:

$$\pm \text{Limit} = k \times I_c$$

wherein k is a proportionality constant that should be previously determined and adjusted as a function of the characteristics of the circuit; and Ic is the current circulating in the load.

Another way of making the adjustment of the +limit and −limit value is by means of a table of pre-established values stored in the control central 44 of the control unit 4, where a value of the current measured in the load is put and the +limit and −limit values are established that should be adopted for the situation of the moment.

The objectives of the present invention are achieved by means of a TRIAC controlling and triggering system, the TRIAC comprising a gate, the TRIAC being connected to a load, the gate being electrically connected to a power unit that actuates the TRIAC for selectively applying a network voltage to the load and enabling the circulation of an electric current in the load, the system comprising a gate-voltage detection unit, a power unit and a control unit, the voltage detection unit being electrically connected to the control unit, the control unit establishing a gate-voltage limit value (+limit, −limit), and generating a pulse at the TRIAC gate to maintain it in conduction, the pulse at the gate being generated from a comparison between the voltage limit value (+limit, −limit) established by the control unit and a voltage measured at the gate from the gate-voltage detection unit. The control unit further measures the electric current and adjusting the voltage limit value (+limit, −limit) in a way proportional to the measured current value.

Further, according to the teachings of the present invention, the objectives aimed are achieved by means of a method of controlling the triggering of a TRIAC, the TRIAC comprising a gate and being electrically connected to a network voltage, the TRIAC being selectively actuated from the pulse at the gate to apply the network voltage to a load, enabling the circulation of a current, a comparator being associated to the TRIAC gate, the method comprising steps of applying a pulse at the gate when the voltage limit value (+limit, −limit) at the gate is detected, the pulse being generated from a transition at the comparator, the comparator comparing the voltage limit value (+limit, −limit) at the gate and a voltage measured at the gate; commuting the input of the comparator between a positive voltage limit (+limit) to a negative limit (−limit) and vice-versa at every transition received by the comparator. The method further comprises steps of, before applying the pulse at the gate, measuring the current that circulates in the load, and adjusting the level of the voltage limit value at the gate (+limit, −limit) in a way proportional to the level of the current.

Further, according to the teachings of the present invention, the above objectives are achieved by means of a method of controlling the triggering of a TRIAC, the TRIAC comprising a gate and being electrically connected to a network voltage, the TRIAC being selectively actuated from a pulse at the gate to apply the network voltage to a load, enabling the circulation of a current, the method comprising steps of: applying a pulse at the gate when the current value is a minimum value, the pulse at the gate being generated in a previously established measurement time, the measurement time occurring before the passage of the current by zero, measuring the current that circulates in the load, and adjusting the level of the voltage limit value (+limit, −limit) of the gate in a way proportional to the level of the current.

BRIEF DESCRIPTION OF THE DRAWINGS

The present invention will now be described in greater details with reference to the figures described hereinafter.

DETAILED DESCRIPTION OF THE FIGURES

Figure 1:
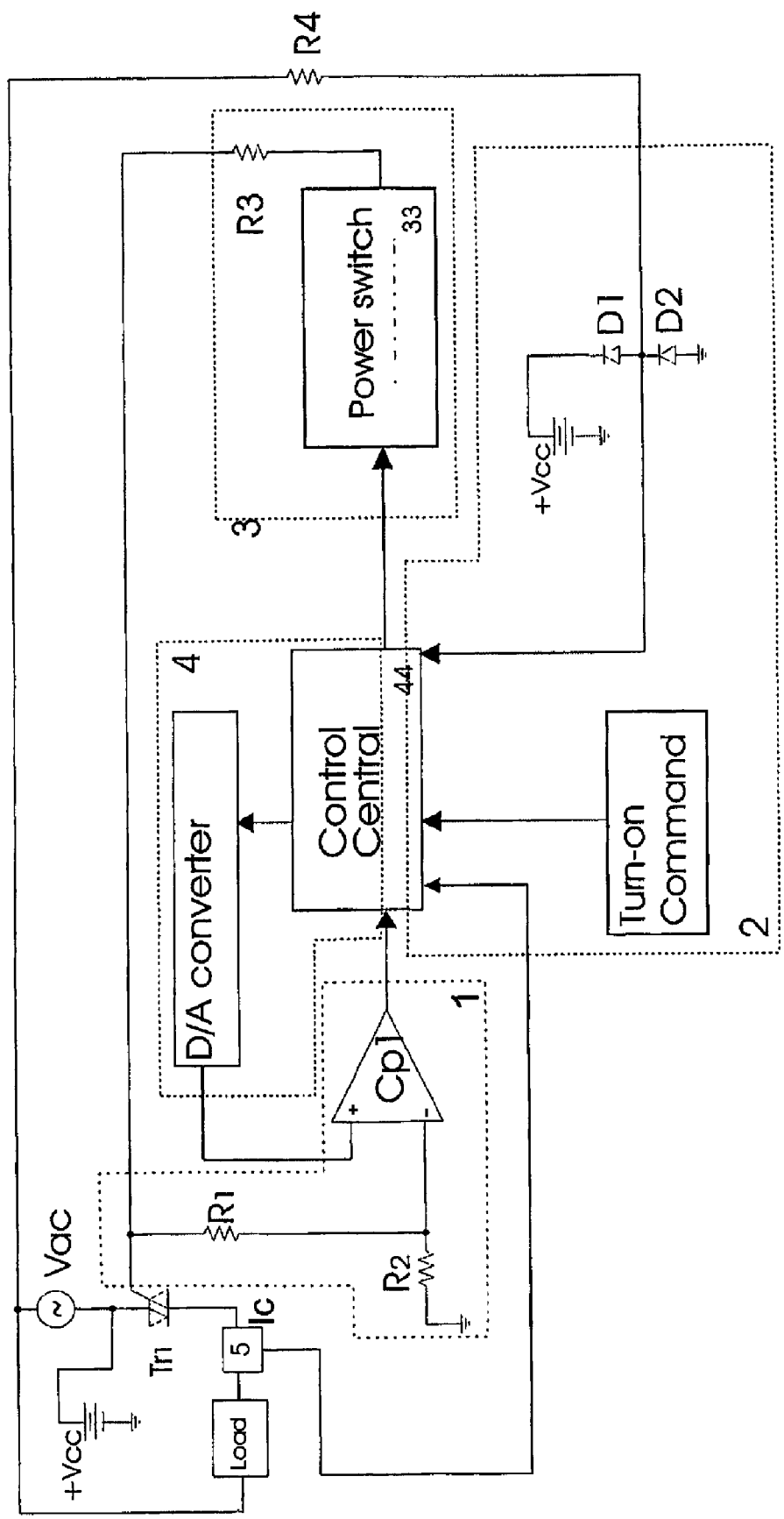
FIG. 1 is an electric diagram of the system according to the present invention.
Figure 2:
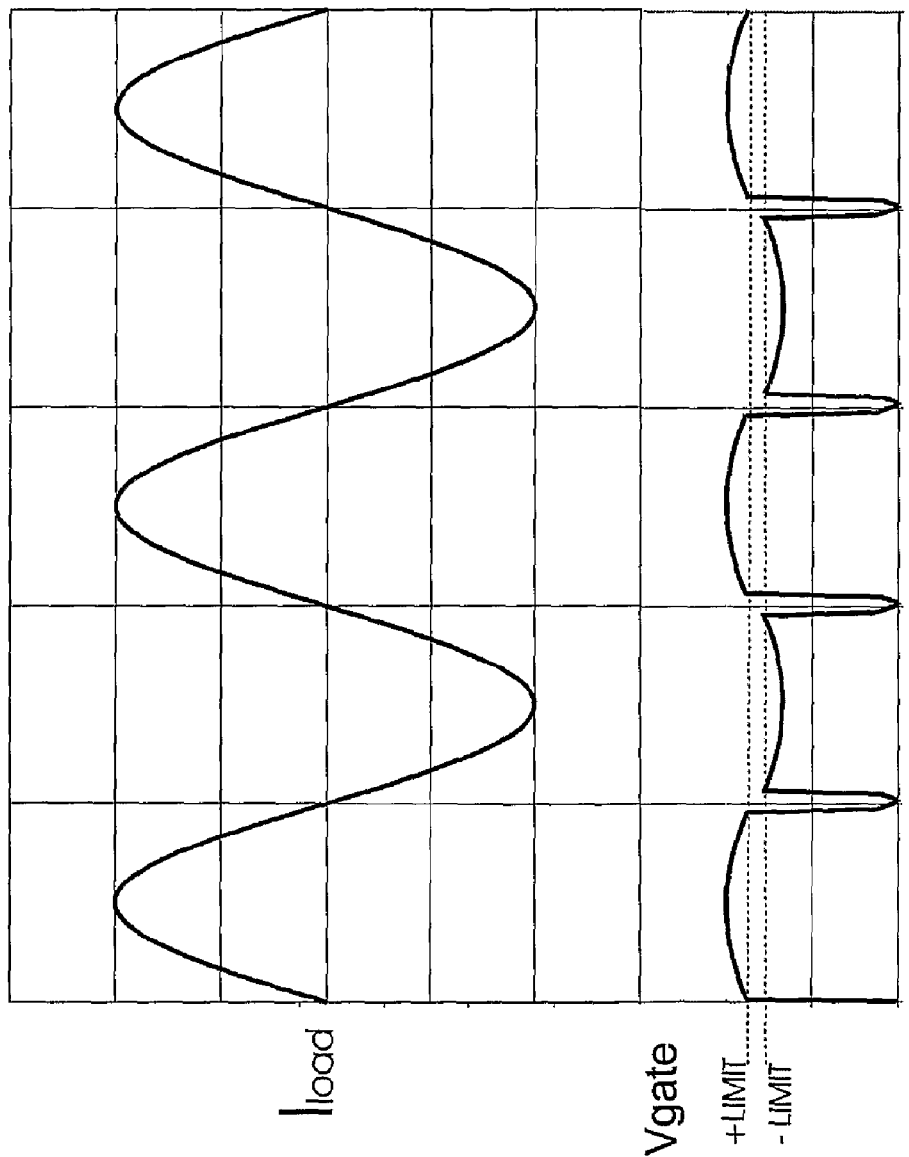
FIG. 2 is a diagram of the wave forms relating to the operation of the system.

According to FIG. 1, it can be seen that the TRIAC controlling and triggering system of the present invention essentially comprises a gate-G voltage detection unit 1, a detection unit for detecting the passage of the voltage from the feed network 2 by zero, a current sensor 5, a power unit 3 and a control unit 4. The current sensor 5 may be constituted by a low-resistance resistor in series with the load, or still a Hall-effect sensor.

The voltage detection unit 1 comprises a resistive divider formed by the resistors $R_1$ and $R_2$, which are associated to the gate G of the TRIAC TR at the input of the resistor $R_1$ and associated to an input of the comparator $CP_1$, which is associated between the resistors $R_1$ and $R_2$. A digital-to-analog (D/A) converter is interconnected to the other input of the comparator $CP_1$ and to a control central 44. The control central 44 may be implemented by means of discrete components, but preferably a microprocessor or a microcontroller is used and a control central 44, which has already the comparator $CP_1$ inside it may be used.

The detection unit for detection of the passage of the feed network 2 voltage by zero comprises protection diodes $D_1$, $D_2$, associated to a direct current voltage $V_{DC}$ and through which the network voltage $V_{AC}$ is fed passing through a resistor $R_4$. The detection unit for detecting the passage of the feed network 2 voltage by zero also receives a command to turn on the system, both being associated to the control central 44.

The power unit 3 comprises a power switch 33, which is interconnected between the control central 4 and the gate G of the TRIAC TR through a resistor $R_3$, while the control unit 4 comprises a control central 44 and the D/A converter. Optionally, the power switch 33 may be inside the control central 44. The power unit 3 may comprise semiconductors capable of supplying and/or draining current sufficient to actuate the TRIAC.

The control unit 4 receives signals of the passage of the feed network voltage $V_{AC}$ by zero, through the connection of a digital input of the control central 44 by means of the resistor $R_4$ and of the protection diodes $D_1$, $D_2$, and also receives signals from the comparator associated to the gate G of the TRIAC TR, and a command signal to turn on the circuit. As an output, the control central 44 may command the power unit 3 through the power switch 33 to actuate the gate G of the TRIAC TR and may further define a voltage value at one of the inputs of the comparator $CP_1$, for instance, the non-inverting input, through the D/A converter. The D/A converter used may have low-resolution, since the input at the non-inverting port of the comparator $CP_1$ may be operated with some voltage levels (which will, for instance, adjust the voltage limit values), and a D/A converter may be used inside or outside the control central 44.

Operationally, the system, after receiving the torn-on command at the control central 44, waits for the passage of the feed network voltage VAC by zero, detected by the control central 44 through the resistor $R_4$. The detection is made during a transition of the network voltage $V_{AC}$ from the negative state to the positive one, for instance, a moment when a pulse at the gate G of the TRIAC TR should be generated with such a duration that enables the current to reach the latch value. Simultaneously the control unit 44 determines that the output of the D/A converter should be equal to a (+limit)/2 value, if $R_1=R_2$ and waits for the output of the comparator $CP_1$ to go to the high level. As already described, the +limit and −limit value is such that, when the voltage at the gate G reaches this value, the current $i_c$ in the load will be higher than the hold current of the TRIAC. At the instant when the output of the comparator $CP_1$ goes to the high level, the control unit 4, through the power unit 3, generates a new pulse at the gate G of the TRIAC TR, since the current $i_c$ approaches zero. The pulse generated should have a duration sufficient to guarantee that the current $i_c$ will again reach the latch value. After the pulse, the control unit 4 determines, at the output of the D/A converter, a value equal to (−limit)/2 and awaits until the output of the comparator goes this time to the low level, generating a new pulse at the gate G of the TRIAC TR. The cycle then may be repeated as long as there is command to turn on the circuit. The control over the D/A converter is effected from a digital signal generated by the control central 44 and the latter, in turn, establishes an adjustment voltage value equal to the +limit and −limit voltage limits.

The adaptability of the system to a broad range of current values by the TIRAC TR is guaranteed by reading the circulating current $i_c$, which allows the control central 44 to correct the −limit and +limit value as a function of this read current. This solution also enables the use of a single comparator $CP_1$, since two gate-G voltage limit values (+limit, −limit) are used.

Figure 4:
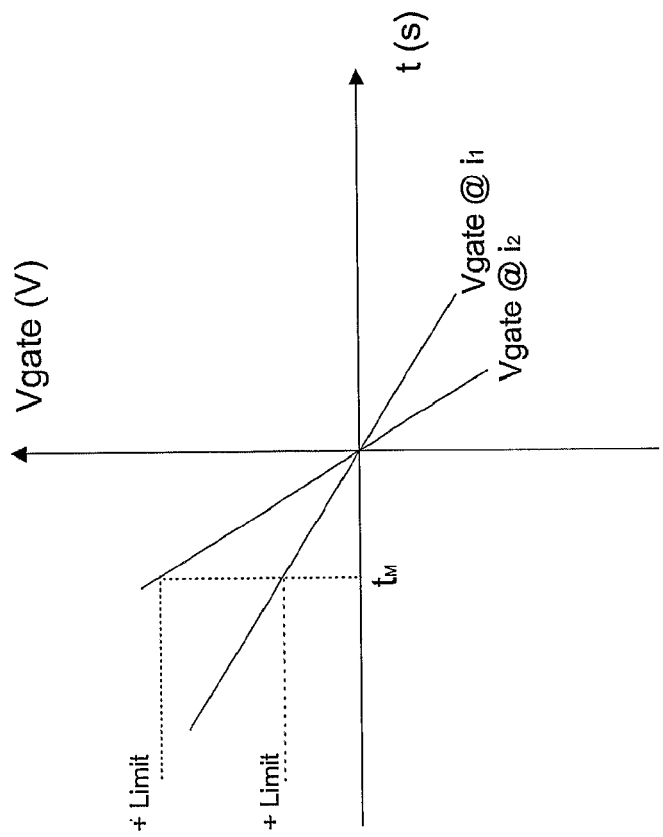
FIG. 4 is a diagram of the wave forms illustrating the gate voltage per time, as a function of the varied currents, applying the teachings of the present invention, with an adjustment of variable limit references for actuating the gate.
Figure 3:
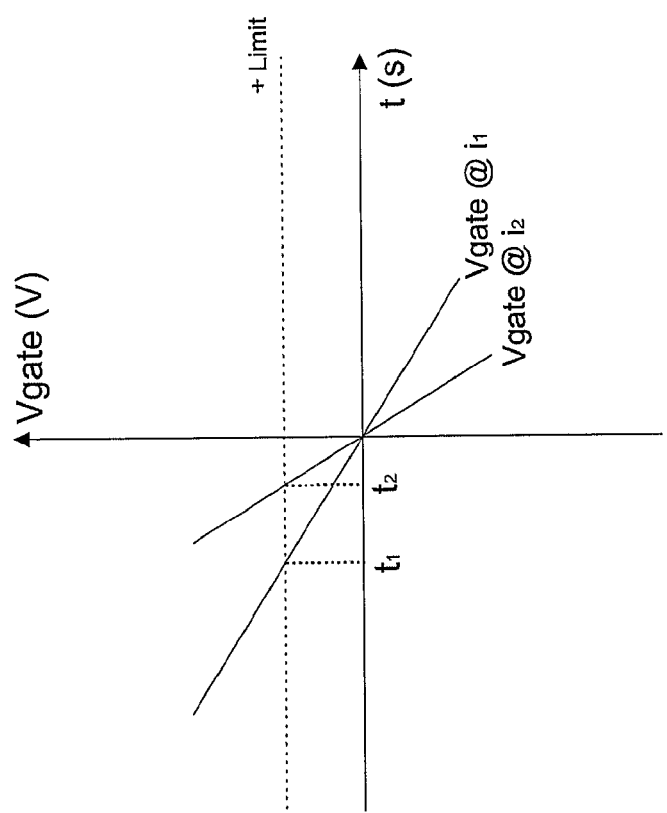
FIG. 3 is a diagram of the wave forms illustrating gate voltage per time, as a function of the varied currents, in the systems known from the prior art.

From FIG. 4, it is possible to follow the result of the correction of the voltage applied to the comparator $CP_1$ through the D/A converter as a function of the current $i_c$, resulting in a fixed time or measurement time $t_M$ between the detection of the gate voltage value (+limit, −limit), which is now variable, and the passage by zero, being sufficient for actuation of the control unit 44 and for permitting a narrow broadness of the pulse applied to the gate G of the TRIAC TR.

Thus, the greater the current $i_c$ detected by the current detector 5, the higher the magnitudes of the values of the positives and negatives limits of gate voltage (+limit and −limit) and, inversely, the lesser the current $i_c$, the lower these values, guaranteeing the generation of pulses with the exact broadness for triggering the TRIAC TR. In any situation, a pulse with a narrow broadness may be generated at the gate G, since this will be always be made from the measurement time $t_M$, which should be previously established to guarantee that the pulse generated at the gate G will have the desired effectiveness, and it should always occur before the passage of the level of the current $i_c$ by zero.

In addition to the continuous triggering of the TRIAC TR, maintaining the network voltage $V_{AC}$ entirely on the load, it is further possible for the voltage $V_{AC}$ to be adjusted to a voltage value in the load from the delay in generating the pulses at the gate G of the TRIAC TR, independently of the power factor of this load, since it is the current circulating through the TRIAC TR that is being monitored.

Specifically with regard to the method for controlling the TRIAC TR, the steps of applying a pulse at the gate G when the voltage limit value (+limit, −limit) at the gate G is detected should be proceeded, the pulse being generated from a transition at the comparator $CP_1$, the comparator $CP_1$ comparing the voltage limit value (+limit, −limit) at the gate G and a voltage measured at the gate G, and commuting an input of the comparator $CP_1$ from a positive voltage limit (+limit) to a negative limit (−limit) and vice-versa at every transition received by the comparator $CP_1$.

Additionally, a step of adjusting the voltage limit values at the gate +limit, −limit is foreseen, which is carried out by applying the equation $\pm\text{Limit}=k\times Ic$ from the control central 44, the step of measuring the current $i_c$ being constantly carried out.

Another way of carrying out the step of adjusting the +limit and −limit value is by means of the table of pre-established values stored at the control central 44 of the control unit 4, where the value of the current measured in the load is entered and the +limit and −limit values are established that should be adopted for the situation of the moment.

A preferred embodiment having been described, one should understand that the scope of the present invention embraces other possible variations, being limited only by the contents of the accompanying claims, which embrace the possible equivalents.

The invention claimed is:

1. A system of controlling and triggering a TRIAC (TR), the TRIAC comprising a gate (G), the TRIAC (TR) being connected to a load, the gate (G) being electrically connected to a power unit that actuates the TRIAC (TR) for selectively applying a network voltage ($V_{AC}$) to the load and enabling the circulation of an electric current ($i_c$) in the load, the system comprising:

a voltage detection unit for detecting gate voltage;
a detection unit for detecting passage of the feed network voltage by zero;
a power unit; and
a control unit;
the voltage detection unit being electrically connected to the control unit,
the control unit establishing an adjustable gate (G) voltage limit value (+limit, −limit), and generating a pulse at the gate (G) of the TRIAC (TR) to keep it in conduction,
the pulse at the gate (G) being generated from a comparison between the voltage limit value (+limit, −limit) established by the control unit and a voltage measured at the gate (G) from the gate voltage detection unit, the detection unit for detecting voltage at the gate (G) comprising a comparator ($CP_1$) electrically connected to the gate (G) of the TRIAC (TR) and to a digital-to-analog (D/A) converter, the comparator ($CP_1$) receiving the signal of the voltage at the gate (G) of the TRIAC (TR) and a signal generated by the D/A converter, the D/A converter receiving a digital signal generated by a control central, the signal generated by the control central establishing an adjustment voltage value, the adjustment voltage value being equal to the limit values (+limit, −limit), the power unit being associated to the control unit and generating a voltage pulse at the gate of the TRIAC (TR) upon a command from the control central, wherein the voltage of the gate (G) of the TRIAC (TR) is applied to the comparator (CP) by means of a resistive divider ($R_1$, $R_2$), and wherein the resistive divider ($R_1$, $R_2$) is formed by resistors of the same value.

2. A system according to claim 1, wherein the control unit measures the electric current ($i_c$) and adjusts the voltage limit value (+limit, −limit) in a proportional way to the current ($i_c$) value measured.

3. A control system according to claim 2, wherein the control unit generates the pulse at the gate (G) of the TRIAC (TR) in previously established a measurement time ($t_M$), the measurement time ($t_M$) occurring before passage of the current ($i_c$) by zero.

4. A system according to claim 2, wherein the control unit obtains the current ($i_c$) value from a current sensor.

5. A system according to claim 2, wherein the adjustment of the limit value (+limit, −limit) is made by means of the equation: +Limit=k×$I_c$, wherein k is a previously determined proportionality constant.

6. A system according to claim 2, wherein the adjustment of the limit (+limit, −limit) is made by means of a table of preestablished values stored in the control unit.

7. A system according to claim 1, wherein the control unit comprises a digital-to-analog (D/A) converter, the digital-to-analog converter generating the adjustment voltage value.

8. A system according to claim 1, wherein the pulse at the TRIAC (TR) is generated when the control central detects a transition of level of the comparator ($CP_1$) output.

9. A system according to claim 1, wherein the control central commands the digital-to-analog (D/A) converter to commute between a positive voltage limit (+limit) to a negative limit (−limit) and vice-versa at every transition received by the comparator ($CP_1$).

10. A system according to claim 1, wherein the digital-to-analog (D/A) converter is internal with respect to the control central.

11. A system according to claim 1, wherein the comparator ($CP_1$) is internal with respect to the control central.

12. A system according to claim 1, wherein the power control unit is an internal switch of the control central.

13. A method of controlling the triggering of a TRIAC (TR), the TRIAC comprising a gate (G) and being electrically connected to a network voltage ($V_{AC}$), the TRIAC (TR) being selectively actuated upon a pulse at the gate (G) to apply the network voltage ($V_{AC}$) to a load, enabling the circulation of a current (ic), a single comparator ($CP_1$) being associated to the gate (G) of the TRIAC (TR), the method comprising:

applying a pulse at the gate (G) when the voltage limit value (+limit, −limit) at the gate (G) has been detected, the pulse being generated from a transition at the comparator ($CP_1$), the comparator ($CP_1$) comparing the voltage limit value (+limit, −limit) at the gate (G) and a voltage measured at the gate (G), wherein the voltage measured at the gate (G) of the TRIAC (TR) is applied to the comparator ($CP_1$) by means of a resistive divider ($R_1$, $R_2$), and wherein the resistive divider ($R_1$, $R_2$) is formed by resistors of the same value, commuting an input of the comparator ($CP_1$) from the positive voltage limit (+limit) to a negative limit (−limit) and vice-versa at every transition received by the comparator ($CP_1$).

14. A method according to claim 13, wherein, prior to the step of applying the pulse at the gate (G), said method comprises the steps of:

measuring the current ($i_c$) circulating in the load, and adjusting the level of the voltage value at the gate (+limit, −limit) proportional to the level of the current ($i_c$).

15. A method according to claim 14, wherein, in the step of adjusting the voltage limit value (+limit, −limit), the equation: +Limit=k×$i_c$ is applied, wherein k is a proportionality constant.

16. A method according to claim 14, wherein, in the step of adjusting the voltage limit value (+limit, −limit), there is a step of reading a table of pre-established values.

17. A method according to claim 14, wherein the voltage pulse at the gate (G) has a duration sufficient for the current circulating in the TRIAC (TR) to reach a latch value.

18. A method according to claim 17, wherein the first pulse of the gate (G) is commanded from a measurement of passage of the network ($V_{AC}$) by zero.

19. A method of controlling the triggering of a TRIAC (TR), the TRIAC comprising a gate (G) and being electrically connected to a network voltage ($V_{AC}$), the TRIAC (TR) being selectively actuated upon a pulse at the gate (G) to apply the network voltage ($V_{AC}$) to a load, enabling the circulation of a current ($i_c$), the method comprising the steps of:

applying a pulse at the gate (G) when the current value ($i_c$) reaches a minimum value, establishing a voltage limit value (+limit, −limit) at the gate (G) to generate the pulse at the gate (G) of the TRIAC (TR) for keeping it in conduction, the pulse at the gate (G) being generated in a previously established measurement time ($t_M$), the measurement time ($t_M$) occurring before passage of the level of the current ($i_c$) by zero, comparing the voltage limit value (+limit, −limit) to the voltage of the gate (G) to determine when to apply the pulse, wherein the voltage of the gate (G) of the TRIAC (TR) is applied to the comparator (CP) by means of a resistive divider ($R_1$, $R_2$) formed by resistors of the same value, measuring the current ($i_c$) that circulates in the load, and adjusting the level of the voltage limit value (+limit, −limit) at the gate (G) by a control unit in a proportional way to level of the current ($i_c$).

20. A method according to claim 19, wherein the current ($i_c$) is continuously measured.

21. A method according to claim 20, wherein, in the step of applying the pulse at the gate (G) of the TRIAC ($TR_1$), regulating the level of voltage in the load from the delay in generating the pulses at the gate (G).

* * * * *